US007802226B2

(12) United States Patent
Park et al.

(10) Patent No.: US 7,802,226 B2
(45) Date of Patent: Sep. 21, 2010

(54) DATA PREPARATION FOR MULTIPLE MASK PRINTING

(75) Inventors: Jea-Woo Park, Wilsonville, OR (US); Emile Y. Sahouria, Sunnyvale, CA (US)

(73) Assignee: Mentor Graphics Corporation ( * ) Notice: Subject to any disclaimer, the term of this patent is extended or adjusted under 35 U.S.C. 154(b) by 383 days.

(21) Appl. No.: 11/621,077

(22) Filed: Jan. 8, 2007

(65) Prior Publication Data
US 2008/0166639 A1 Jul. 10, 2008

(51) Int. Cl.
*G06F 17/50* (2006.01)
(52) U.S. Cl. .................................. 716/21; 716/19
(58) Field of Classification Search ............. 716/19–21; 430/5, 22, 30
See application file for complete search history.

(56) References Cited
U.S. PATENT DOCUMENTS

| | | | |
|---|---|---|---|
| 4,532,650 A | 7/1985 | Wihl et al. |
| 4,762,396 A | 8/1988 | Dumant et al. |
| 5,396,584 A | 3/1995 | Lee et al. |
| 5,502,654 A | 3/1996 | Sawahata |
| 5,655,110 A | 8/1997 | Krivokapic et al. |
| 5,723,233 A | 3/1998 | Garza et al. |
| 5,815,685 A | 9/1998 | Kamon |
| 5,825,647 A | 10/1998 | Tsudaka |
| 5,879,844 A | 3/1999 | Yamamoto et al. |
| 5,991,006 A | 11/1999 | Tsudaka |
| 6,016,357 A | 1/2000 | Neary et al. |
| 6,033,814 A | 3/2000 | Burdorf et al. |
| 6,042,257 A | 3/2000 | Tsudaka |
| 6,049,660 A | 4/2000 | Ahn et al. |
| 6,077,310 A | 6/2000 | Yamamoto et al. |
| 6,080,527 A | 6/2000 | Huang et al. |

(Continued)

FOREIGN PATENT DOCUMENTS

JP 09319067 12/1997

(Continued)

OTHER PUBLICATIONS

Adam et al., "Improved Modeling Performance with an Adapted Vectorial Formulation of the Hopkins imaging Equation," *Proceedings of SPIE: Optical Microlithography XVI*, vol. 5040, pp. 78-91 (Feb. 25, 2003).

(Continued)

*Primary Examiner*—Jack Chiang
*Assistant Examiner*—Binh C Tat
(74) *Attorney, Agent, or Firm*—Klarquist Sparkman, LLP

(57) ABSTRACT

A method for preparing data to create two or more masks required to print a desired feature pattern with a multiple mask technique. In one embodiment of the invention, a target feature pattern is separated into two or more groups or data layers with a coloring algorithm. Coloring conflicts or adjacent features that are within a predetermined distance of each other and are assigned to the same group or data layer are identified. Cutting boxes are added to a feature to divide a feature into two or more smaller features. A coloring algorithm is re-applied to the layout including the cutting boxes to assign the features into different groups or data layers. Data in each group or data layer is used to define a mask to print the target feature pattern.

20 Claims, 7 Drawing Sheets

U.S. PATENT DOCUMENTS

| | | | |
|---|---|---|---|
| 6,120,952 A | 9/2000 | Pierrat et al. | |
| 6,128,067 A | 10/2000 | Hashimoto | |
| 6,187,483 B1 | 2/2001 | Capodieci et al. | |
| 6,243,855 B1 | 6/2001 | Kobayashi et al. | |
| 6,249,904 B1 | 6/2001 | Cobb | |
| 6,263,299 B1 | 7/2001 | Aleshin et al. | |
| 6,269,472 B1 | 7/2001 | Garza et al. | |
| 6,285,783 B1 | 9/2001 | Isomura et al. | |
| 6,301,697 B1 | 10/2001 | Cobb | |
| 6,370,679 B1 | 4/2002 | Chang et al. | |
| 6,415,421 B2 | 7/2002 | Anderson et al. | |
| 6,425,113 B1 | 7/2002 | Anderson et al. | |
| 6,425,117 B1 | 7/2002 | Pasch et al. | |
| 6,430,737 B1 | 8/2002 | Cobb et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,499,003 B2 | 12/2002 | Jones et al. | |
| 6,503,666 B1 | 1/2003 | Pierrat | |
| 6,516,459 B1 | 2/2003 | Sahouria | |
| 6,553,562 B2 | 4/2003 | Capodieci et al. | |
| 6,574,784 B1 | 6/2003 | Lippincott et al. | |
| 6,584,610 B1 | 6/2003 | Wu et al. | |
| 6,620,561 B2 | 9/2003 | Winder et al. | |
| 6,643,616 B1 | 11/2003 | Granik et al. | |
| 6,649,309 B2 | 11/2003 | Mukherjee | |
| 6,668,367 B2 | 12/2003 | Cobb et al. | |
| 6,681,379 B2 | 1/2004 | Pierrat | |
| 6,748,578 B2 | 6/2004 | Cobb | |
| 6,785,879 B2 * | 8/2004 | Pierrat | 716/21 |
| 6,787,271 B2 | 9/2004 | Cote et al. | |
| 6,792,590 B1 | 9/2004 | Pierrat et al. | |
| 6,811,935 B2 | 11/2004 | Pierrat | |
| 6,817,003 B2 | 11/2004 | Lippincott et al. | |
| 6,857,109 B2 | 2/2005 | Lippincott | |
| 6,861,204 B2 | 3/2005 | Cote et al. | |
| 6,883,158 B1 * | 4/2005 | Sandstrom et al. | 716/19 |
| 6,887,633 B2 | 5/2005 | Tang | |
| 6,901,574 B2 | 5/2005 | LaCour et al. | |
| 6,901,575 B2 | 5/2005 | Wu et al. | |
| 6,928,634 B2 | 8/2005 | Granik et al. | |
| 6,973,633 B2 | 12/2005 | Lippincott et al. | |
| 6,978,436 B2 | 12/2005 | Cote et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,028,285 B2 | 4/2006 | Cote et al. | |
| 7,047,516 B2 | 5/2006 | Futatsuya | |
| 7,069,534 B2 | 6/2006 | Sahouria et al. | |
| 7,073,162 B2 | 7/2006 | Cobb et al. | |
| 7,138,212 B2 | 11/2006 | Hsu et al. | |
| 7,155,699 B2 | 12/2006 | Cobb | |
| 7,165,234 B2 | 1/2007 | Pierrat | |
| 7,181,721 B2 | 2/2007 | Lippincott et al. | |
| 7,216,331 B2 | 5/2007 | Wu et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,281,226 B2 | 10/2007 | Wu et al. | |
| 7,281,234 B2 | 10/2007 | Lippincott | |
| 7,293,249 B2 | 11/2007 | Torres Robles et al. | |
| 7,312,003 B2 | 12/2007 | Cote et al. | |
| 7,324,930 B2 | 1/2008 | Cobb | |
| 7,348,108 B2 | 3/2008 | Cote et al. | |
| 7,367,009 B2 | 4/2008 | Cobb et al. | |
| 7,435,513 B2 * | 10/2008 | Cote et al. | 430/5 |
| 7,458,059 B2 * | 11/2008 | Stirniman et al. | 716/21 |
| 7,500,217 B2 | 3/2009 | Cote et al. | |
| 2004/0005089 A1 | 1/2004 | Robles et al. | |
| 2004/0142251 A1 | 7/2004 | Hsu et al. | |
| 2005/0149901 A1 | 7/2005 | Tang | |
| 2005/0251771 A1 | 11/2005 | Robles | |
| 2005/0278686 A1 | 12/2005 | Word et al. | |
| 2006/0188796 A1 | 8/2006 | Word | |
| 2006/0199084 A1 | 9/2006 | Word | |
| 2006/0200790 A1 | 9/2006 | Shang et al. | |
| 2006/0240342 A1 | 10/2006 | Tang | |
| 2006/0277521 A1 | 12/2006 | Chen et al. | |
| 2006/0288325 A1 | 12/2006 | Miyamoto et al. | |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0245291 A1 | 10/2007 | Wu et al. | |
| 2008/0020296 A1 | 1/2008 | Hsu et al. | |
| 2008/0076042 A1 | 3/2008 | Cote et al. | |
| 2008/0141195 A1 | 6/2008 | Robles et al. | |
| 2008/0148217 A1 | 6/2008 | Park | |
| 2008/0307381 A1 | 12/2008 | Tritchkov et al. | |
| 2009/0125867 A1 | 5/2009 | Cote et al. | |
| 2010/0050149 A1 | 2/2010 | Cote et al. | |

FOREIGN PATENT DOCUMENTS

| | | |
|---|---|---|
| JP | 11-102380 | 4/1999 |
| JP | 2004-502961 | 1/2004 |
| WO | WO 99/14637 | 3/1999 |
| WO | WO 99/14638 | 3/1999 |
| WO | WO 01/65315 | 7/2001 |
| WO | WO 01/97096 | 12/2001 |
| WO | WO/02/03140 | 1/2002 |
| WO | WO/02/101468 | 12/2002 |

OTHER PUBLICATIONS

Bailey et al., "Double pattern EDA solutions for 32nm HP and beyond," *Proc. SPIE*, vol. 6521, pp. 65211K-1 through 65211K-12 (2007).

Bailey et al., "Intensive 2D SEM Model Calibration for 45nm and Beyond," *Proceedings of SPIE*, vol. 6154, 10 pp. (Feb. 21, 2006).

Brist et al., "Effective Multicutline QUASAR Illumination Optimization for SRAM and Logic," *Proceedings of SPIE: Design and Process Integration for Microelectronic Manufacturing*, vol. 5042, pp. 153-159 (Feb. 27, 2003).

Brist et al., "Illumination Optimization Effects on OPC and MDP," *Proceedings of SPIE*, vol. 5754, pp. 1179-1189 (Mar. 1, 2005).

Brist et al., "Source Polarization and OPC Effects on Illumination Optimization," *Proceedings of SPIE, 25th Annual BACUS Symposium on Photomask Technology*, vol. 5992, pp. 599232-1/9 (Oct. 3, 2005).

Chen et al., "RET Masks for the Final Frontier of Optical Lithography," *Proceedings of SPIE: Photomask and Next-Generation Lithography Mask Technology XII*, vol. 5853, pp. 168-179 (Apr. 13, 2005).

Cobb et al., "Experimental Results on Optical Proximity Correction With Variable Threshold Resist Model," *Proceedings of SPIE: Symposium on Optical Microlithography X*, vol. 3051, pp. 458-468 (Mar. 10-14, 1997).

Cobb et al., "Fast, Low-Complexity Mask Design," *Proceedings of SPIE: Symposium on Optical/Laser Microlithography VIII*, vol. 2440, pp. 313-327 (Feb. 22-24, 1995).

Cobb et al., "Fast Sparse Aerial Image Calculation for OPC," *Proceedings of SPIE: 15th Annual BACUS Symposium on Photomask Technology and Management*, vol. 2621, pp. 534-545 (Sep. 20-22, 1995).

Cobb, "Flexible Sparse and Dense OPC Algorithms," *Proceedings of SPIE, Photomask and Next-Generation Lithography Mask Technology XII*, vol. 5853, pp. 693-702 (Apr. 13, 2005).

Cobb et al., "Large Area Phase-Shift Mask Design," *Proceedings of SPIE, Symposium on Optical/Laser Microlithography VII*, vol. 2197, pp. 348-360 (Mar. 2-4, 1994).

Cobb et al., "Mathematical and CAD Framework for Proximity Correction," *Proceedings of SPIE: Symposium on Optical Microlithography IX*, vol. 2726, pp. 208-222 (Mar. 13-15, 1996).

Cobb et al., "Model-Based OPC Using the MEEF Matrix," *Proceedings of SPIE, 22nd Annual BACUS Symposium on Photomask Technology*, vol. 4889, 10 pp. (Sep. 30-Oct. 4, 2002).

Cobb et al., "New Concepts in OPC," *Proceedings of SPIE: Optical Microlithography XVII*, vol. 5377, pp. 680-690 (Feb. 24, 2004).

Cobb et al., "OPC Methods to Improve Image Slope and Process Window," *Proceedings of SPIE: Design and Process Integration for Microelectronic Manufacturing*, vol. 5042, pp. 116-125 (Feb. 27, 2003).

Cobb et al., "Using OPC to Optimize for Image Slope and Improve Process Window," *Proceeding of SPIE, Photomask Japan*, vol. 5130, pp. 838-846 (Apr. 16-18, 2003).

Granik, "Generalized MEEF Theory," *Interface 2001*, 13 pp. (Nov. 2001).

Granik et al., "MEEF as a Matrix," *Proceedings of SPIE: 21st Annual BACUS Symposium on Photomask Technology*, vol. 4562, pp. 980-991 (Oct. 2-5, 2001).

Granik, "New Process Models for OPC at sub-90nm Nodes," *Proceedings of SPIE: Optical Microlithography XVI*, vol. 5040, pp. 1166-1175 (Feb. 25, 2003).

Granik, "Solving Inverse Problems of Optical Microlithography," *Proceedings of SPIE: Optical Microlithography XVIII*, vol. 5754, pp. 506-526 (Mar. 1, 2005).

Granik et al., "Two-Dimensional G-MEEF Theory and Applications," *Proceedings of SPIE: Symposium on Photomask and Next-Generation Lithography Mask Technology IX*, vol. 4754, pp. 146-155 (Apr. 23-25, 2002).

Granik et al., "Universal process modeling with VTRE for OPC," *Proceedings of SPIE: Optical Microlithography XV*, vol. 4691, pp. 377-394 (Mar. 5, 2002).

Hong et al., "Impact of Process Variance on 65 nm Across-Chip Linewidth Variation," *Proceedings of SPIE: Design and Process Integration for Microelectronic Manufacturing IV*, vol. 6156, pp. 61560Q1-9 (Feb. 23, 2006).

Liebmann, "Layout Methodology Impact of Resolution Enhancement Technique," *Electronic Design Process*, 7 pp. (2003).

Lucas et al., "Reticle Enhancement Verification for 65 nm and 45 nm Nodes," *Proceedings of SPIE: Design and Process Integration for Microelectronic Manufacturing IV*, vol. 6156, pp. 61560Q1-9 (Feb. 23, 2006).

Maenhoudt et al., "Double Patterning Scheme for Sub-0.25 k1 Single Damascene Structure at NA=0.75, $\lambda$=193 nm," *Proceedings of SPIE: Optical Microlithography XVIII*, vol. 5754, pp. 1508-1518 (Mar. 1, 2005).

Maurer et al., "Evaluation of a Fast and Flexible OPC Package: OPTISSIMO," *Proceedings of SPIE: 16th Annual Symposium on Photomask Technology and Management*, vol. 2884, pp. 412-418 (Sep. 18-20, 1996).

Maurer et al., "Process Proximity Correction Using an Automated Software Tool," *Proceedings of SPIE: Optical Microlithography XI*, vol. 3334, pp. 245-253 (Feb. 22-27, 1998).

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Mentor Graphics Corporation, News and Views, "Calibre," including a partial translation, 9 pp. (document marked Apr. 2000).

Ohnuma et al., "Lithography Computer Aided Design Technology for Embedded Memory in Logic," *Japanese Journal of Applied Physics*, vol. 37(12B), pp. 6686-6688 (Dec. 1998).

Op de Beeck et al., "Manufacturability issues with double patterning for 50-nm half-pitch single damascene applications using RELACS® shrink and corresponding OPC," *Proc. SPIE*, vol. 6520, pp. 65200I-1 through 65200I-13 (2007).

Park et al., "Application Challenges with Double Patterning Technology Beyond 45 nm," *Proceedings of SPIE: Photomask Technology 2006*, vol. 6349, pp. 634922-1 through 634922-12 (Sep. 19, 2006).

Schellenberg, "Sub-Wavelength Lithography Using OPC," *Semiconductor Fabtech*, 9th ed., pp. 205-209 (Mar. 1999).

Torres et al., "Design Verification Flow for Model-Assisted Double Dipole Decomposition," *Proceedings of SPIE: Optical Microlithography XV*, vol. 4691, pp. 585-592 (Mar. 5, 2002).

Torres et al., "Model Assisted Double Dipole Decomposition," *Proceedings of SPIE: Optical Microlithography XV*, vol. 4691, pp. 407-417 (Mar. 5, 2002).

Torres et al. "RET-Compliant Cell Generation for Sub-130 nm Processes," *Proceedings of SPIE: Optical Microlithography XV*, vol. 4691, pp. 529-539 (Mar. 5, 2002).

Wiaux et al., "193 nm Immersion Lithography Towards 32 nm hp Using Double Patterning," $3^{rd}$ *International Symposium on Immersion Lithography*, 23 pp. (Oct. 2-5, 2006).

Word et al. "Advanced Layout Fragmentation and Simulation Schemes for Model Based OPC," *Proceedings of SPIE: Optical Microlithography XVIII*, vol. 5754, pp. 1159-1168 (Mar. 1, 2005).

Park et al., "Robust Double Exposure Flow for Memory," 11 pp. (also published as Park et al., "Robust Double Exposure Flow for Memory," *Proc. SPIE: Optical Microlithography XIX*, vol. 6154, pp. 808-817 (Feb. 19, 2006)).

* cited by examiner

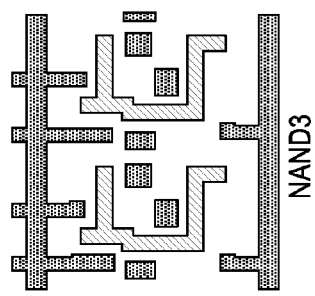
Fig. 2A NOR3
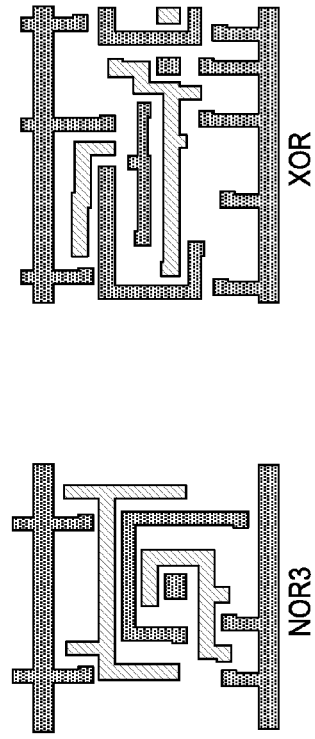
Fig. 2B XOR
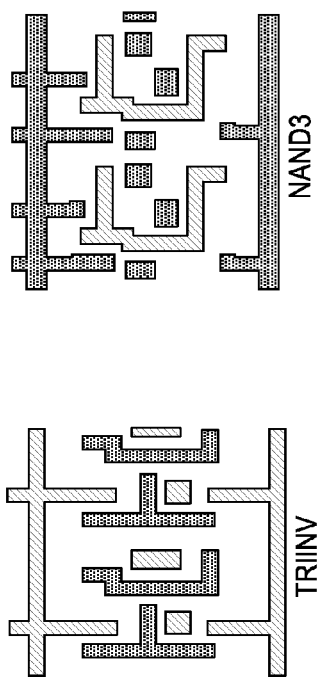
Fig. 2C TRIINV
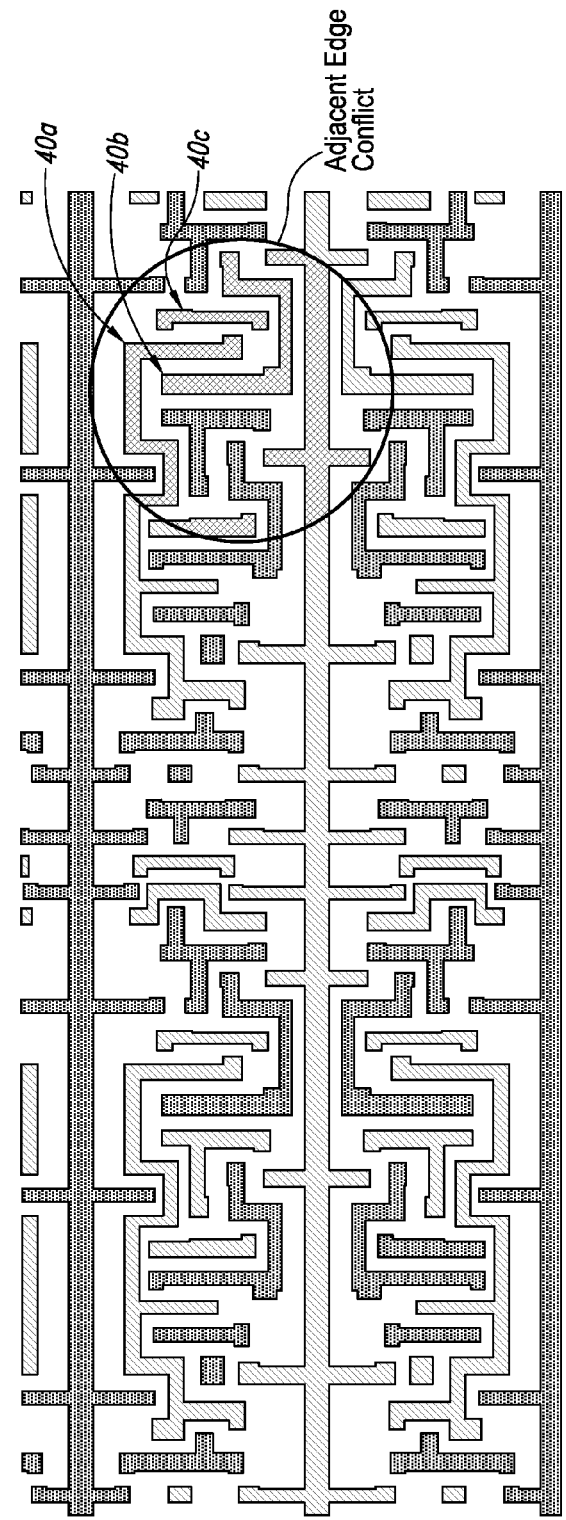
Fig. 2D NAND3
Fig. 2E

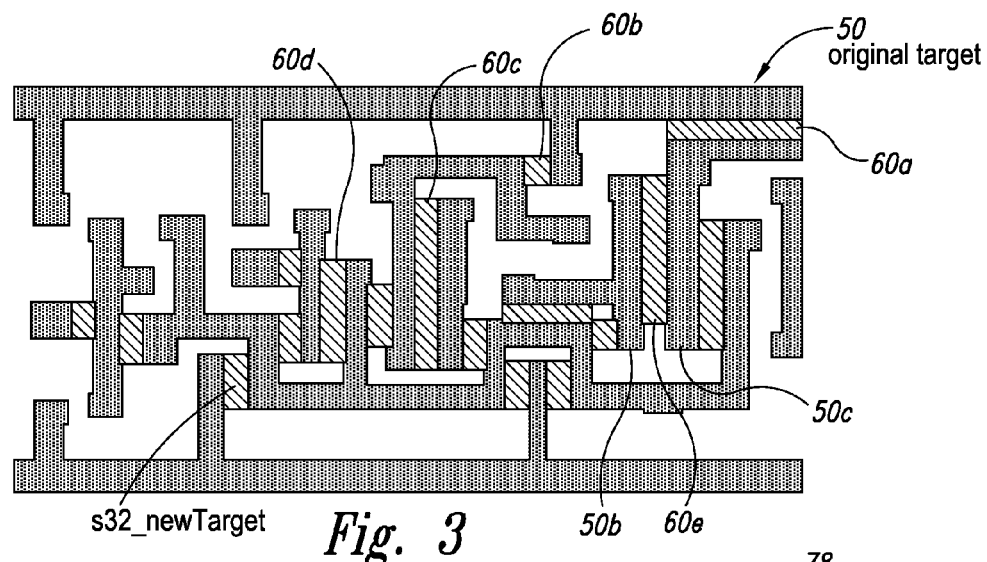
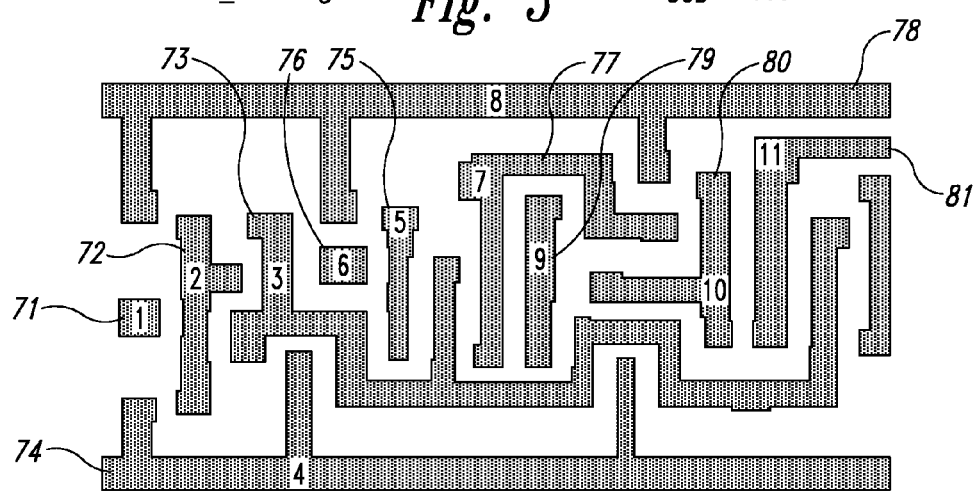
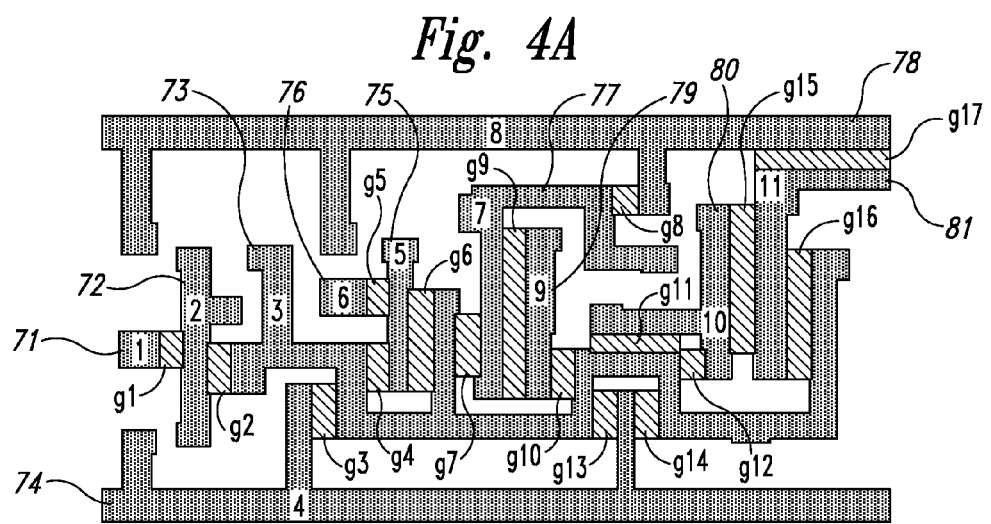

DATA PREPARATION FOR MULTIPLE MASK PRINTING

FIELD OF THE INVENTION

The present invention relates to photolithographic processing, and in particular to mask data preparation techniques for lithographic processes using multiple mask photolithography.

BACKGROUND OF THE INVENTION

Most integrated circuits are created by exposing a pattern of features contained on a mask (sometimes referred to as a reticle) onto a silicon wafer that is coated with photosensitive materials. The exposed wafer is then chemically and mechanically processed to create corresponding objects or circuit elements on the wafer. Other circuit patterns are then exposed onto the wafer to build up the integrated circuit layer by layer.

As the circuit elements become smaller and smaller, the ability of a photolithographic printing system to print the features on the wafer becomes increasingly diminished. Optical and other process distortions occur such that the pattern contained on the mask will often not match the pattern of circuit elements that is printed on the wafer. To address this problem, numerous resolution enhancement techniques, such as optical and process correction (OPC) and other tools, such as phase shifting masks, subresolution assist features, etc., have been developed to enhance the fidelity with which a desired pattern can be printed on a wafer. One technique that is becoming increasingly used to print tightly packed features on a wafer is known as double patterning. In double patterning, a layout is parsed into two sets of polygons, with each set following design rules that allow it to be individually printable. Each set of polygons is then patterned onto the wafer. The phrase "double patterning" usually refers to a bright field, positive toned process, in which the polygons to be patterned are separated into two sets of dark (light blocking) polygons in an otherwise clear transparent field, and exposure to a mask with one set of polygons is completely processed (i.e. wafer coated with resist, and resist then exposed, developed and etched) before repeating the entire process again with a mask with the second set of polygons. Because the entire patterning sequence is repeated, this is called "double patterning", as opposed to "double exposure", where two exposures are made with different masks before the wafer is processed.

The present invention relates to improvements in multiple mask photolithographic printing techniques such as double patterning and double exposure processing techniques.

SUMMARY OF THE INVENTION

The present invention is a method of preparing data to create photolithographic masks or reticles for use in a multiple mask photolithographic process. A desired layout pattern of features is divided into two or more data layers or groups, wherein each group or data layer defines the data for a different mask or reticle. In one embodiment of the invention, a coloring algorithm is used to divide a target layout pattern into the two or more groups of features. The features in each group are inspected for features that are within a predetermined distance of each other and assigned to the same group. Features so located are broken up into smaller features that can be separated into groups to maintain the distance between features assigned to the same group.

In one embodiment of the invention, the division of a feature into two or more smaller features is made by adding a cutting box to the feature. The polygons of a feature that includes a cutting box are extended to overlap in the region of the cutting box to ensure proper printing during the photolithographic process.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 2A-2D illustrate various integrated circuit layout designs that can be printed with a double patterning technique;

FIG. 2E illustrates an integrated circuit layout design that is difficult to print with a double patterning technique;

FIG. 3 illustrates one technique for designating features of a desired layout in accordance with one embodiment of the present invention;

FIGS. 4A and 4B illustrate the creation of a virtual gate layer used by a coloring algorithm in accordance with an embodiment of the present invention;

DETAILED DESCRIPTION OF THE PREFERRED EMBODIMENTS

Figure 1A:
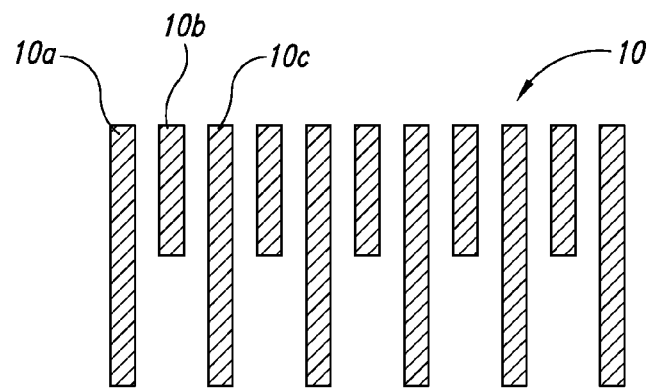
FIGS. 1A and 1B illustrate how a desired pattern of features can be printed with a double patterning technique.
Figure 1B:
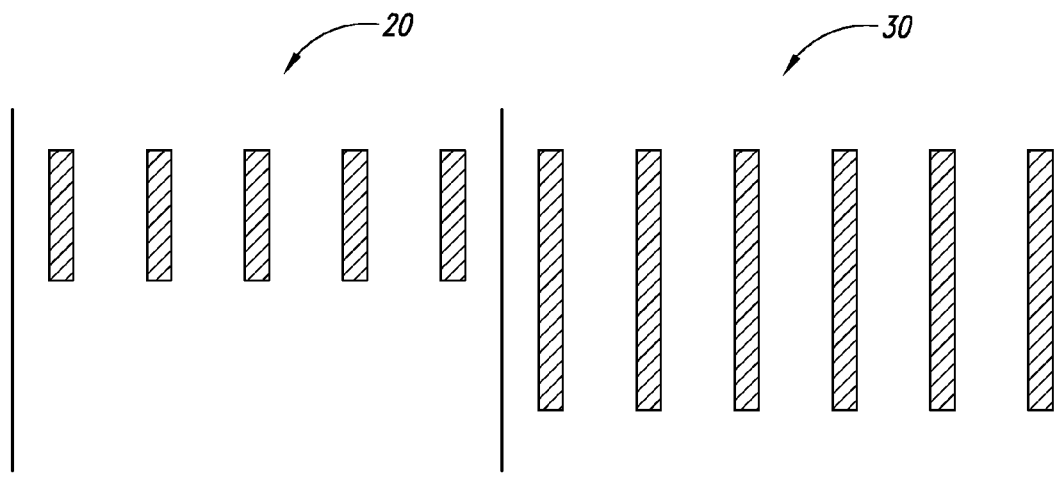

FIGS. 1A and 1B illustrate the basic operation of a double patterning photolithographic printing process. A target layout 10 includes a number of features 10*a*, 10*b*, 10*c*, etc., that are to be printed on a semiconductor wafer. The minimum pitch or distance between each feature that can be imaged on a wafer is determined by the resolving ability of the photolithographic printing system. One technique used to print features that are closer together than the photolithographic printing system would normally allow is a double patterning technique.

With double patterning, the desired pattern of features to be printed on a wafer is divided among two or more masks wherein each mask prints one set of features on the wafer. The masks print sets of features that are interleaved such that the features printed by both masks have a pitch that is closer than that obtainable with a single mask alone. For example, as shown in FIG. 1B, the desired target pattern 10 is divided into a first set of features 20 and a second set of features 30. The first set of features 20 is printed on a wafer with one mask and the second pattern of features 30 is printed on the wafer with another mask. The distance between each of the features in the first set 20 and the second set 30 is selected so that the features can be resolved on the wafer by the photolithographic printing system. However, the masks are configured such that the result printed on the wafer will match the desired target pattern 10. These double patterning algorithms, however, could also be applied to a dark field process, in which the polygons are bright apertures in an otherwise dark field. The same algorithms would separate the polygons for fabrication as two masks.

Figure 1C:
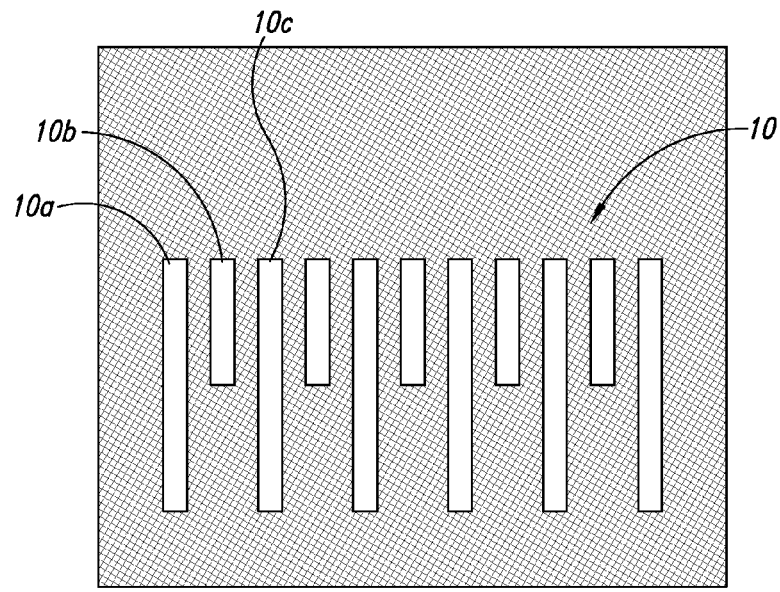
FIGS. 1C and 1D illustrate how a desired pattern of features can be printed with a double exposure technique.
Figure 1D:
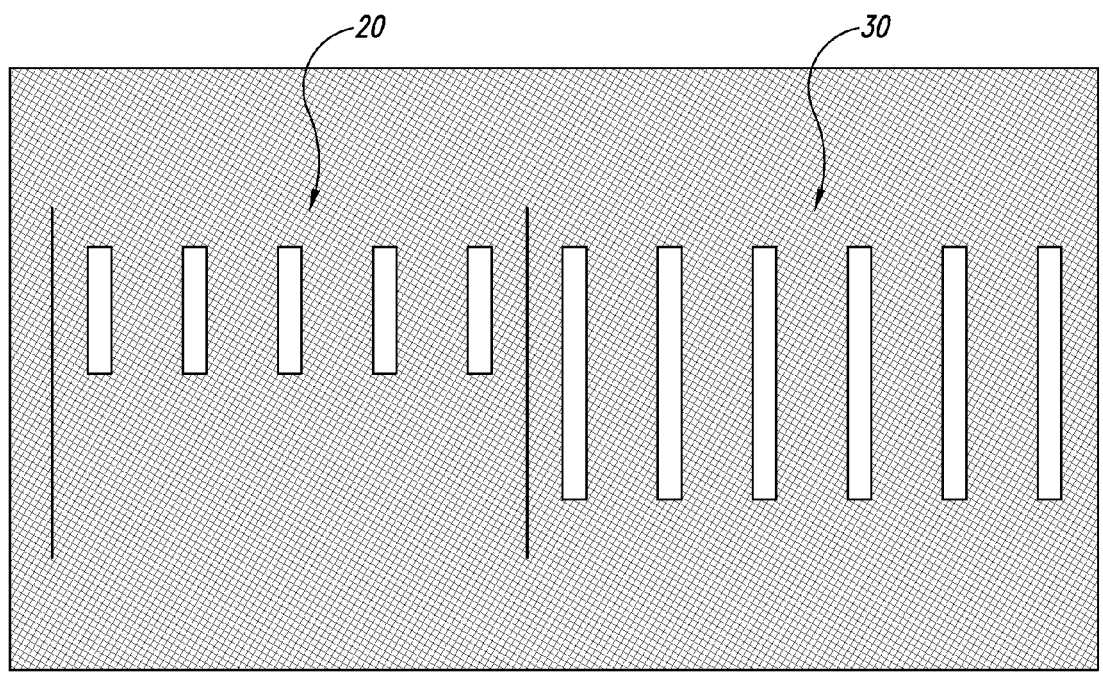
Figure 5:
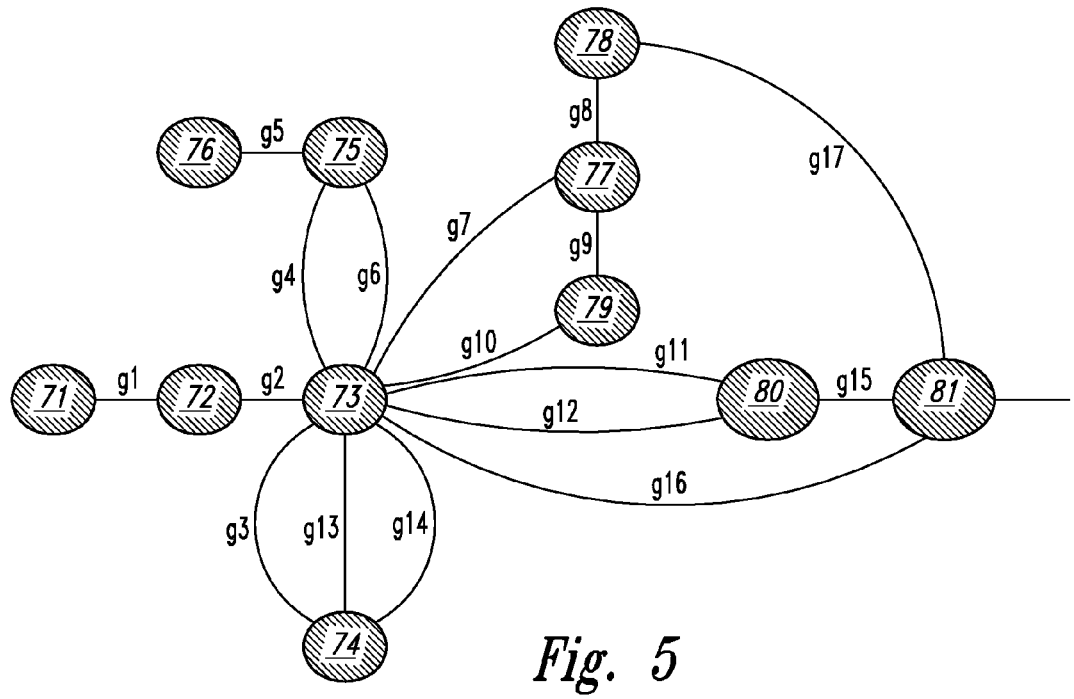
FIGS. 5, 6, and 7 illustrate how a graph of features is searched and separated into different groups in accordance with one embodiment of the present invention.

FIGS. 1C and 1D illustrate how a pattern of features 10 can be printed on a wafer with a double exposure technique. With this technique, the pattern of features to be printed on a wafer can be grouped into data for one or more dark field masks as shown in FIG. 1D. The features on each dark field mask are spaced such that they can be reliably printed with the photolithographic printing system.

In practice, many desired feature patterns can be divided into two separate groups and printed with different masks. FIGS. 2A, 2B, 2C, and 2D illustrate common circuit layouts having features that can be divided into a first group as identified by the solid polygons and a second group as identified by the dashed polygons that can be printed using two masks and the double patterning technique. In each layout group, the features are divided such that the distance between features in each group is sufficient to allow the features to be printed by the photolithographic printing system.

FIG. 2E shows an example of a desired layout pattern of features that is more difficult to separate into two masks. In this example, features 40a, 40b, 40c are assigned to the same group, as illustrated by the dashed patterns on the features. However, the distance between the features 40a, 40b, and 40c is such that they cannot be reliably printed with a single mask. In addition, there is no way to assign the features in the layout pattern to the different groups in a manner that ensures that adjacent features are not assigned to the same group.

The present invention is a technique to overcome the problems associated with designating features in a desired layout in a manner that allows a double patterning or double exposure printing technique to be used with more desired feature patterns.

FIG. 3 illustrates a representative target pattern of features 50 to be printed on a semiconductor wafer. In one embodiment, the features are defined as polygons in a layout database language such as GDS-II or OASIS™. In accordance with one embodiment of the invention, a new target pattern 60 is defined having features 60a, 60b, 60c, 60d etc. (the dashed polygons). Each feature in the new target pattern 60 is defined by the features in the original target pattern 50 such that each of the features in the new target pattern has two edges adjacent features in the original target pattern 50.

For example, a new feature 60e is adjacent a feature 50b on one side and a feature 50c on the other side in the original target pattern. To separate the features in the original target pattern 50 into different groups for use in creating separate masks, a coloring algorithm can be run with the new target pattern 60 as an input.

The following is one example of a script of computer executable instructions that may be stored on a computer-readable media such as a hard drive, CD-ROM, memory card or transmitted over a wired or wireless communication link to a computer system that executes the instructions to perform the present invention. The script creates a new target layer (s32_newTarget) that is used by a coloring algorithm, as described below, to divide the features into two different data layers (mask_0, mask_1). The resulting data layers are then checked by a design rule checking algorithm (DRC) that confirms that all features are spaced appropriately for the mask.

LAYER target      23
s32_long_edge = LENGTH target > 0.09
s32_edge = EXTERNAL \[s32_long_edge\] <= 0.055 OPPOSITE
s32_expand = EXPAND EDGE s32_edge OUTSIDE BY 0.055
s32_source - COPY target
s32_newTarget = s32_expand NOT target
s32_psmOut = LITHO PSMGATE s32_source s32_newTarget
mask_0 = target NOT s32_psmOut
mask_1 = COPY s32_psmOut
mask_0 {COPY mask_0}
    DRC CHECK MAP mask_0 210
    mask_1 {COPY mask_1}
DRC CHECK MAP mask_1 211

The coloring algorithm operates to assign different properties to the features that are adjacent each feature in the input data layer. Using polygon 60e as an example, a coloring algorithm assigns a first property to the polygon 50b on the left vertical edge of polygon 60e and assigns another property to the polygon 50c on the right vertical edge of polygon 60e. The property assigned to each feature can be of any type that allows the features to be grouped. For example, the features can be assigned a color (e.g. blue or green), a number (1 or 0), a logical value (true or false) or any other identifier whereby features to be grouped have the same property. In the embodiment of the invention described, the property is assigned by grouping features into one of two different data layers in a layout database.

In one embodiment of the present invention, the coloring algorithm used is Mentor Graphics' PSMGate program. PSMGate is typically used to assign phase shift values to features in order to create gates at the boundaries of features having opposite phase values. In this case, the features on each side of the "virtual gate" input layer such as the polygons 60 shown in FIG. 3 are divided into different groups to form the separate masks.

FIGS. 4-7 illustrate how the coloring algorithm in PSM-Gate assigns adjacent features in a sample layout pattern to different data layers.

First, each polygon among the polygons to be parsed is assigned a unique identification number (e.g., 71, 72, 73, . . . n for n polygons—see FIG. 4A). This can be only for a single cell, or for many cells in a layout. Then, each connection between these polygons through a polygon in the "gate" or "pseudo-gate" layer is also assigned a unique identifier (e.g., g1, g2, g3, g4, . . . gm for m gates—see FIG. 4B).

These relationships are used to construct a graph, with the polygons 71 through n as nodes and "gates" as connections between the nodes. See FIG. 5.

Figure 6:
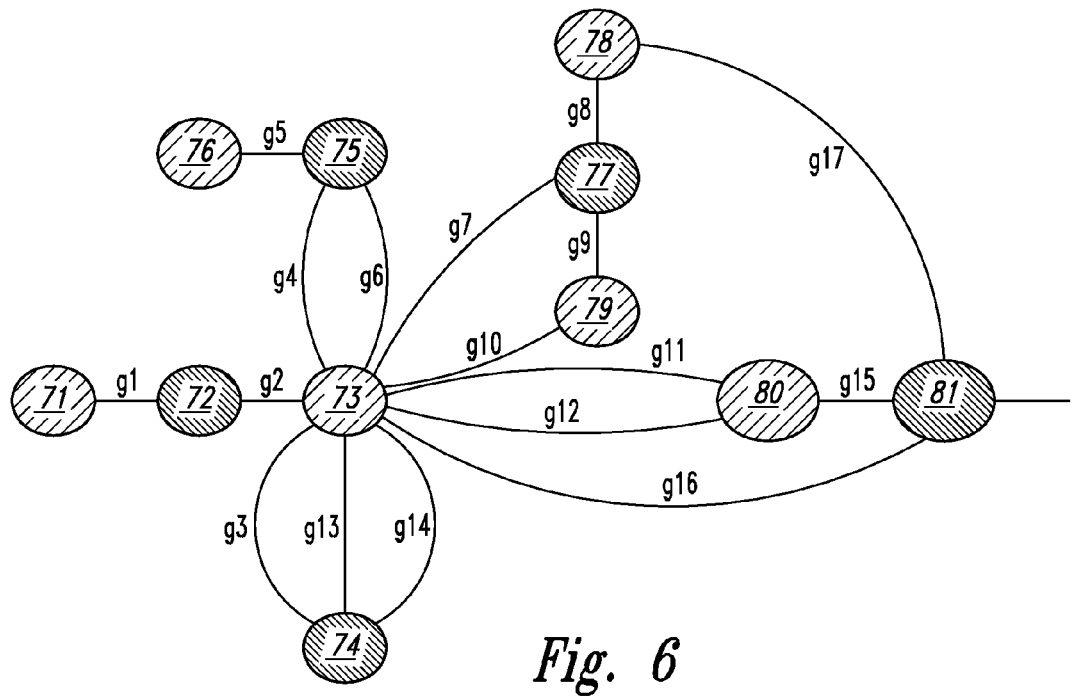

A node in the graph is selected as the starting point. A "Depth-First Search" is then carried out, assigning the nodes to either group A or group B as the search progresses through the graph. A sequence of steps follows (as shown below), and a colored graph (indicated by plain or hashed nodes) is shown in FIG. 6.

Depth-first search coloring starting with Node 71.
  Sequence moves generally from left to right through the layout, following each chain encountered to its end.
  Assign Node 71 to layer A (Hashed)
  Node 71 connected by g1 to Node 72; assign Node 72 to layer B (plain)
  Node 72 connected by g2 to Node 73; assign Node 73 to layer A (hashed)

Node 73 connected by g4/g6 to Node 75; assign Node 75 to layer B (plain)

Node 75 connected by g5 to Node 76; assign Node 76 to layer B (plain).

End of chain. Back to Node 73.

Node 73 connected by g3/g13/g14 to Node 74; assign Node 74 to layer B (plain)

End of chain. Back to Node 73.

Node 73 connected by g7 to Node 77; assign Node 77 to layer B (plain)

Node 77 connected by g8 to Node 78; assign Node 78 to layer A (hashed)

Node 78 connected by g17 to Node 81; assign Node 81 to layer B (plain)

Node 81 connected by g15 to Node 80; assign Node 80 to layer A (hashed)

The next step would be

Node 80 connected by g11/g12 to Node 73; assign Node 73 to layer B (plain)

but this is not possible because Node 73 is already assigned. Back to Node 77.

Node 77 connected by g9 to Node 79; assign Node 79 to layer A (hashed)

The next step would be

Node 79 connected by g10 to Node 73; assign Node 73 to layer B (plain)

but this is not possible because Node 73 is already assigned.

End of chain. Back to Node 81.

Node 81 connected to . . . (next polygon off illustrated graph).

Once a polygon has been assigned to either group A or B, it is not reassigned. Conflicts occur when a newly assigned polygon in another branch of the tree has a portion that connects to a polygon that is already assigned. When an assigned polygon is encountered, the algorithm currently does nothing, and instead moves on with the next node in the search. Such coloring conflicts are generally referred to as "phase conflicts" when the coloring algorithm is used to assign phase shift values to polygons. However, as used herein the term coloring conflict can encompass any two polygons that are assigned to the same group and are within a predetermined distance of each other.

Although the polygon assignment algorithm does not identify these conflicts as they are created, they are easily detected after the assignment is finished by using a DRC check for minimum spacing among the polygons assigned to collection group A or collection group B.

Note also that there need not be a single layer of "virtual gates." The gates can actually be on multiple data layers as well, some assigned a higher priority than others (indicated by the data layer used to store them). Coloring can first be done using a graph constructed using only the high priority "gates," then re-colored using all the gates.

Figure 7:
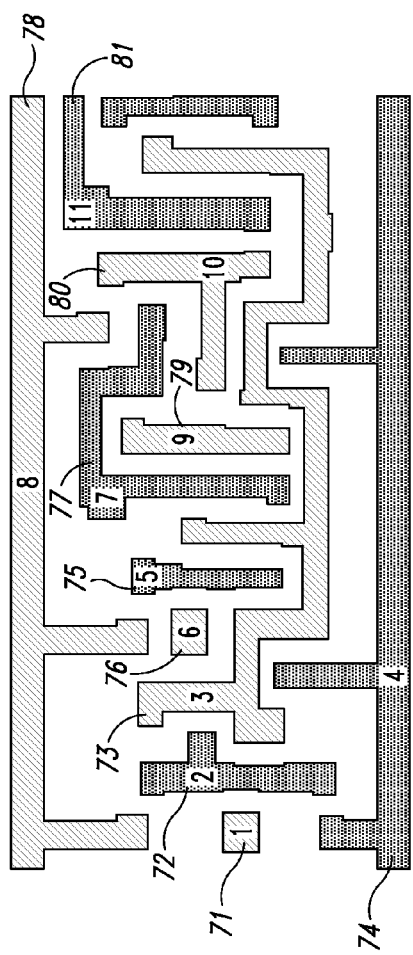

From the initial assignment of features into two different groups or data layers, a determination can be made if features in each group or data layer do not have the minimum separation required for printing with a single mask. These features can be readily identified by software programs which determine the distance between adjacent features. If the distance is less than or equal to some predetermined amount, and the features are assigned to the same group or data layer, a user can be alerted to the fact that a coloring conflict exists. In most cases, coloring conflicts occur in features having a "U" or other bent shape that enclose other polygons within their interior. As can be seen in the example shown in FIG. 2E, coloring conflicts occur with the feature 40a having a U-shape that encloses the feature 40b. Similarly, the initial separation of features shown in FIG. 7 illustrates coloring conflicts between features 73, 79, and 80.

Figure 8:
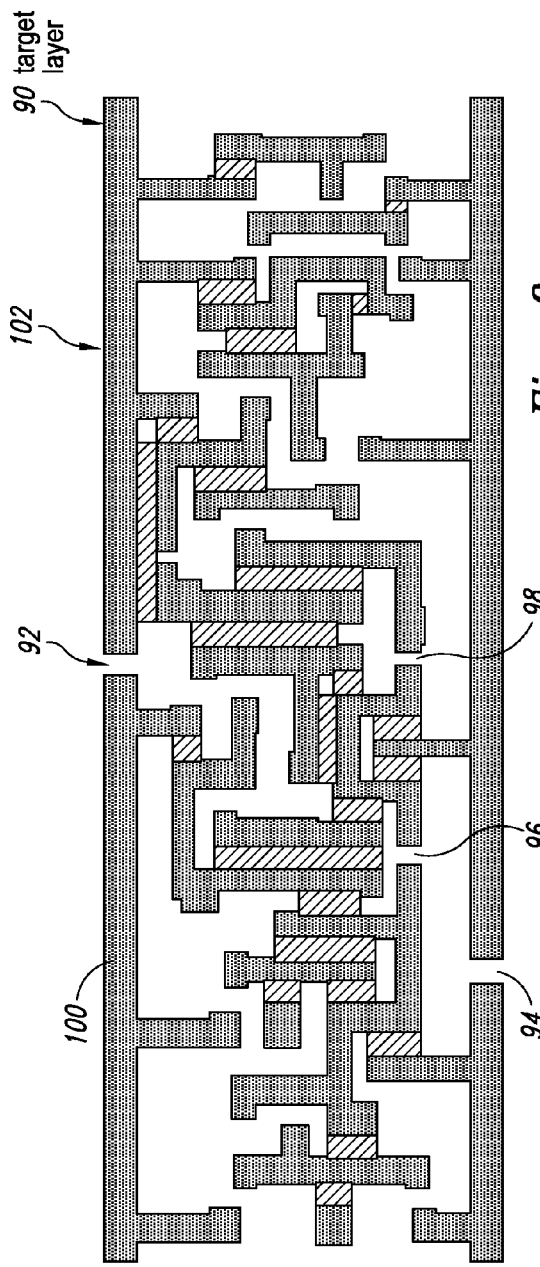
FIG. 8 illustrates a layout pattern of features including a number of cutting boxes in accordance with an embodiment of the present invention.

To rectify the coloring conflicts, one embodiment of the present invention introduces one or more separation points into a feature to divide the feature into two or more parts. With a feature divided, the coloring algorithm is reapplied to the desired target pattern in an attempt to separate the features into two or more groups without coloring conflicts. In one embodiment, the separation points are called cutting boxes and are defined as polygons having a length and width. FIG. 8 illustrates a target pattern of features 90 that include a number of cutting boxes 92, 94, 96, and 98. Each of the cutting boxes divides a feature into two smaller features. For example cutting box 92, divides a feature into two portions 100 and 102. In one embodiment of the invention, the cutting boxes are positioned manually by a user after viewing the coloring conflicts created by the initial assignment of the layout features by the coloring algorithm. Often, the cutting boxes are placed in the curved portion of a U-shaped feature.

Once the cutting boxes have been placed into the layout, a new virtual gate layer can be defined in the same manner as shown in FIG. 3 and described above. A coloring algorithm is then re-run to re-assign the features in the original target layer into different groups or data layers.

Figure 9:
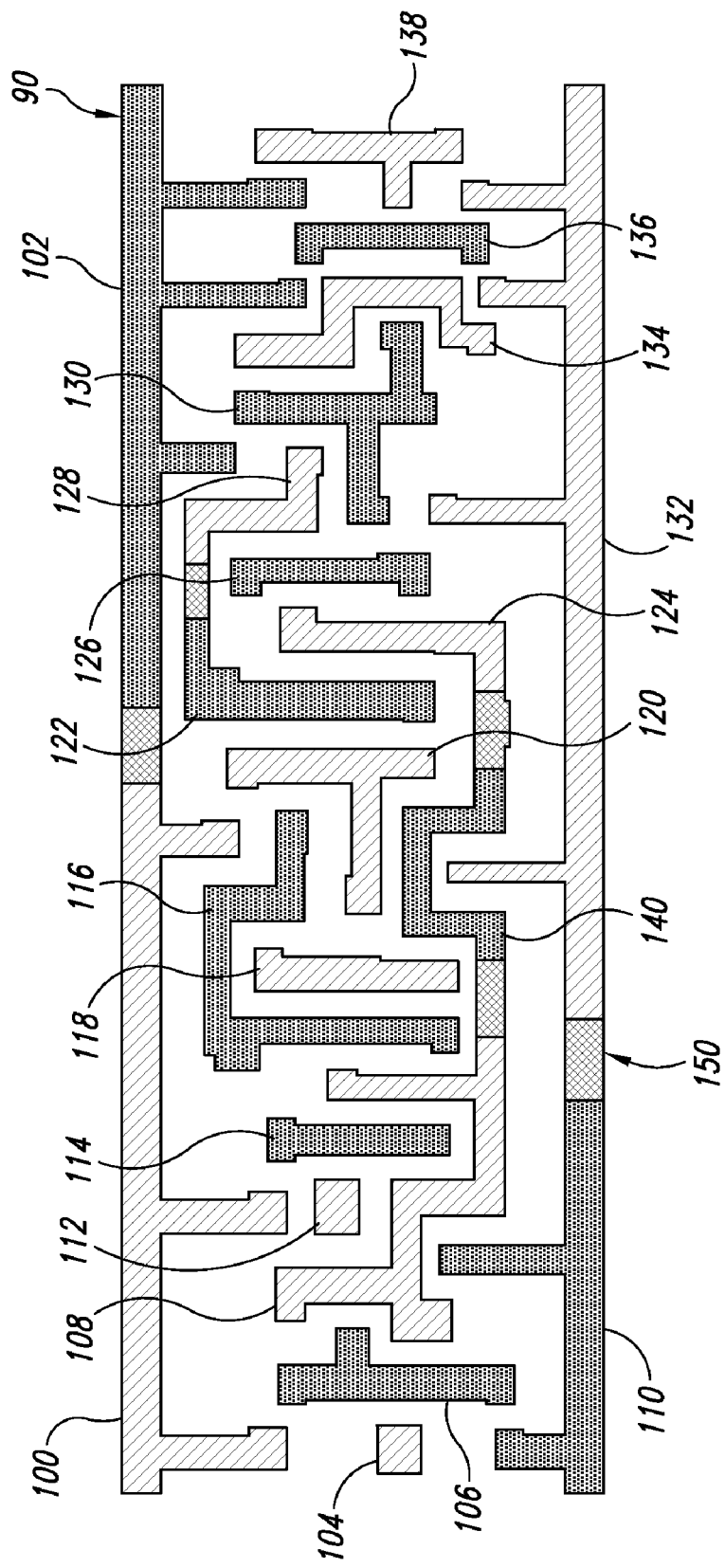
FIG. 9 illustrates features that are assigned to different data layers and that overlap in the area of the cutting boxes in accordance with one embodiment of the present invention.

FIG. 9 illustrates the target layer 90 that shown in FIG. 8 after it has been analyzed by the coloring algorithm that separates the features including the cutting boxes into different data layers or groups. One group or data layer of features comprises the polygons 100, 104, 108, 112, 118, 120, 124, 128, 132, 134, and 138, while the other group or data layer includes polygons 102, 106, 110, 114, 116, 122, 126, 130, 136, and 140. In one embodiment of the invention, the polygons are extended over the region of the cutting boxes, so that when the polygons are printed with the double patterning technique, no discontinuities or other printing defects occur in the area where a feature was divided by a cutting box. For example, area 150 illustrates an overlapping area where both polygons 110 and 132, have been extended in the region of a cutting box 94 as shown in FIG. 8. By overlapping the polygons the cut feature will be printed as it was originally designed.

Although the present invention has been described with respect to its preferred embodiments, it will be appreciated that changes could be made without departing from the scope of the invention. For example, although the locations of cutting boxes are determined manually based on an identification of coloring conflicts that occur with an initial analysis of a layout, it will be appreciated that other techniques, such as software algorithms, could be used to determine where the cutting boxes should be placed. For example, in one embodiment, it is possible to determine if a feature includes an even number of polygons within its boundaries. If so, it is likely that a coloring conflict will occur with this feature and the feature can be divided into two or more smaller features with one or more cutting boxes. In addition, although the disclosed embodiment of the invention uses two masks to print a target layout pattern, it will be appreciated that the invention could be applied to designating a target pattern into three or more groups or data layers, where each group or data layer is used in making a mask for use with a multiple mask printing technique. Finally, although the disclosed embodiments primarily illustrate the grouping of features into bright field masks for double patterning processing, it will be appreciated that the invention is equally useable with processing techniques of the type shown in FIGS. 1C and 1D, which could be fabricated with either double patterning or double exposure The embodiments of the invention in which an exclusive property or privilege is claimed are defined as follows:

1. A method of preparing data to create two or more mask layouts for photolithographic printing of a desired pattern of features on a wafer, comprising:
   receiving data representative of a desired layout design including a number of features to be created on a wafer;
   designating adjacent features in the desired layout design into two or more groups;
   identifying features that are assigned to the same group that are within a predetermined distance of each other;
   introducing one or more cut points to an identified feature to break the identified feature into smaller features;
   re-designating the adjacent features in the desired layout design including the cut points into two or more groups; and
   using a computer, assigning the features in each of the two or more groups to separate mask layouts, wherein the separate mask layouts are for separate masks to be separately exposed during the photolithographic printing.

2. The method of claim 1, wherein the features are designated into two or more groups with a coloring algorithm.

3. The method of claim 2, wherein the groups are data layers in a layout database.

4. The method of claim 1, wherein the features are designated by defining a new target layer of features positioned between the features of the desired layout pattern and applying a phase coloring algorithm to the new target layer.

5. The method of claim 4, where the phase coloring algorithm operates by:
   defining a graph of features having nodes that represent the features that are joined by links representing the features of the new target layer; and
   searching the graph and designating the nodes to different groups.

6. The method of claim 5, wherein the graph is searched with a depth first search algorithm.

7. The method of claim 1, further comprising manufacturing separate masks for each of the separate mask layouts.

8. The method of claim 1, further comprising manufacturing an integrated circuit using the separate mask layouts.

9. A method of preparing data to create two or more mask layouts for photolithographic printing of a desired pattern of features on a wafer, comprising:
   receiving data representative of a desired layout design including a number of features to be created on a wafer;
   designating adjacent features in the desired layout design into two or more groups;
   identifying features that are assigned to the same group that are within a predetermined distance of each other;
   introducing one or more cut points to an identified feature to break the identified feature into smaller features;
   re-designating the adjacent features in the desired layout design including the cut points into two or more re-designated groups, wherein the two or more re-designated groups include a first group and a second group; and
   using a computer, assigning the features in each of the two or more re-designated groups to separate mask layouts for separate masks, wherein:
   the separate mask layouts include a first mask layout and a second mask layout;
   features re-designated into the first group are assigned to the first mask layout; and
   features re-designated into the second group are assigned to the second mask layout.

10. The method of claim 9, wherein the features are designated by defining a new target layer of features positioned between the features of the desired layout pattern and applying a phase coloring algorithm to the new target layer.

11. The method of claim 9, further comprising:
    manufacturing a first mask using the first mask layout; and
    manufacturing a second mask using the second mask layout.

12. The method of claim 9, further comprising:
    printing features assigned to the first mask layout on a wafer; and
    subsequently printing features assigned to the second mask layout on the wafer.

13. The method of claim 9, further comprising manufacturing an integrated circuit, wherein the manufacturing comprises:
    exposing a wafer to create features assigned to the first mask layout; and
    after the exposing, exposing the wafer again to create features assigned to the second mask layout.

14. A computer-readable storage device storing computer-executable instructions that when executed by a computer system, cause the computer system to perform a method of preparing data to create two or more mask layouts for photolithographic printing of a desired pattern of features on a wafer, the method comprising:
    receiving data representative of a desired layout design including a number of features to be created on a wafer;
    designating adjacent features in the desired layout design into two or more groups;
    identifying features that are assigned to the same group that are within a predetermined distance of each other;
    introducing one or more cut points to an identified feature to break the identified feature into smaller features;
    re-designating the adjacent features in the desired layout design including the cut points into two or more groups; and
    assigning the features in each of the two or more groups to separate mask layouts, wherein the separate mask layouts are for separate masks to be separately exposed during the photolithographic printing.

15. The computer-readable storage device of claim 14, wherein the features are designated into two or more groups with a coloring algorithm.

16. The computer-readable storage device of claim 15, wherein the groups are data layers in a layout database.

17. The computer-readable storage device of claim 14, wherein the features are designated by defining a new target layer of features positioned between the features of the desired layout pattern and applying a phase coloring algorithm to the new target layer.

18. The computer-readable storage device of claim 17, where the phase coloring algorithm operates by:
    defining a graph of features having nodes that represent the features that are joined by links representing the features of the new target layer; and
    searching the graph and designating the nodes to different groups.

19. The computer-readable storage device of claim 18, wherein the graph is searched with a depth first search algorithm.

20. The computer-readable storage device of claim 14, wherein:
    the two or more groups include a first group and a second group;

the separate mask layouts include a first mask layout and a second mask layout;
features re-designated into the first group are assigned to the first mask layout; and
features re-designated into the second group are assigned to the second mask layout.

* * * * *